United States Patent
Yu et al.

(10) Patent No.: US 8,674,487 B2
(45) Date of Patent: Mar. 18, 2014

(54) SEMICONDUCTOR PACKAGES WITH LEAD EXTENSIONS AND RELATED METHODS

(75) Inventors: Lin-Wang Yu, New Taipei (TW); Ping-Cheng Hu, Kaohsiung (TW); Che-Chin Chang, Kaohsiung (TW); Yu-Fang Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/421,570

(22) Filed: Mar. 15, 2012

(65) Prior Publication Data

US 2013/0241041 A1 Sep. 19, 2013

(51) Int. Cl.
 *H01L 23/495* (2006.01)

(52) U.S. Cl.
 USPC .... 257/676; 257/666; 257/670; 257/E23.004; 257/E23.037; 257/E23.043; 257/E23.046; 257/E23.052

(58) Field of Classification Search
 USPC ............. 257/666, E23.004, E23.043–E23.05; 438/123, 111, 112, FOR. 366, 438/FOR. 367, FOR. 377, FOR. 380
 See application file for complete search history.

(56) References Cited

U.S. PATENT DOCUMENTS

| | | | |
|---|---|---|---|
| 5,847,458 A | 12/1998 | Nakamura et al. | |
| 6,001,671 A | 12/1999 | Fjelstad | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,348,726 B1 | 2/2002 | Bayan et al. | |
| 6,400,004 B1 | 6/2002 | Fan et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,528,893 B2 | 3/2003 | Jung et al. | |
| 6,534,330 B2 | 3/2003 | Sakamoto et al. | |
| 6,545,347 B2 | 4/2003 | McClellan | |
| 6,586,677 B2 | 7/2003 | Glenn | |
| 6,658,734 B2 | 12/2003 | Yamada et al. | |

(Continued)

FOREIGN PATENT DOCUMENTS

| | | |
|---|---|---|
| CN | 101442035 | 5/2009 |
| CN | 101540309 | 9/2009 |

(Continued)

OTHER PUBLICATIONS

Lai et al.; "Development and performance charaterizations of a QFN/HMT package"; Electronic Components and Technology Conference; pp. 964-967 (2008).

*Primary Examiner* — Jasmine Clark
(74) *Attorney, Agent, or Firm* — Klein, O'Neill & Singh, LLP (57) ABSTRACT

A semiconductor package with a die pad, a die disposed on the die pad, and a first lead disposed about the die pad. The first lead includes a contact element, an extension element extending substantially in the direction of the die pad, and a concave surface disposed between the contact element and the extension element. A second lead having a concave surface is also disposed about the die pad. The first lead concave surface is opposite in direction to the second lead concave surface.

18 Claims, 9 Drawing Sheets

(56) References Cited

U.S. PATENT DOCUMENTS

| | | |
|---|---|---|
| 6,664,615 B1 | 12/2003 | Bayan et al. |
| 6,700,188 B2 | 3/2004 | Lin |
| 6,812,552 B2 | 11/2004 | Islam et al. |
| 6,861,295 B2 | 3/2005 | Jung et al. |
| 6,927,096 B2 | 8/2005 | Shimanuki |
| 6,993,594 B2 | 1/2006 | Schneider |
| 6,995,459 B2 | 2/2006 | Lee et al. |
| 7,049,177 B1 | 5/2006 | Fan et al. |
| 7,125,798 B2 | 10/2006 | Sakamoto et al. |
| 7,183,630 B1 | 2/2007 | Fogelson et al. |
| 7,247,526 B1 | 7/2007 | Fan et al. |
| 7,271,032 B1 | 9/2007 | McLellan et al. |
| 7,608,930 B2 | 10/2009 | Kasuya et al. |
| 7,683,461 B2 | 3/2010 | Lau |
| 7,807,498 B2 | 10/2010 | Shoji et al. |
| 8,125,062 B2 | 2/2012 | Shoji et al. |
| 8,377,750 B2 | 2/2013 | Camacho et al. |
| 2003/0006055 A1 | 1/2003 | Chien-Hung et al. |
| 2005/0247944 A1 | 11/2005 | Haque et al. |
| 2007/0018291 A1 | 1/2007 | Huang et al. |
| 2007/0052076 A1 | 3/2007 | Ramos et al. |
| 2007/0059863 A1 | 3/2007 | Li et al. |
| 2007/0085199 A1 | 4/2007 | Ong et al. |
| 2007/0181983 A1 | 8/2007 | Takai et al. |
| 2008/0067649 A1 | 3/2008 | Matsunaga et al. |
| 2008/0258278 A1 | 10/2008 | Ramos et al. |
| 2010/0044843 A1 | 2/2010 | Chang Chien et al. |
| 2011/0140252 A1* | 6/2011 | Camacho et al. ............. 257/676 |

FOREIGN PATENT DOCUMENTS

| | | |
|---|---|---|
| CN | 102044510 | 5/2011 |
| JP | 5166985 | 7/1993 |
| JP | 11195733 | 7/1999 |
| JP | 2001024135 | 1/2001 |

* cited by examiner

SEMICONDUCTOR PACKAGES WITH LEAD EXTENSIONS AND RELATED METHODS

BACKGROUND

The present invention relates to semiconductor package structures and methods of making, and in particular to Quad Flat No-lead (QFN) packages and methods of making.

DESCRIPTION OF RELATED ART

Semiconductor packages include various package types. One type is the Quad Flat No-lead (QFN) package, which is characterized by short signal transmission path and rapid signal transmission speed. These packages are suitable for high frequency (e.g. radio frequency bandwidth) chip packages, and for low pin count packages.

In one method of making a conventional QFN package, a plurality of chips, or dies, are secured to die pads of a lead frame wafer. The dies are electrically connected to leads of the lead frame via bonding wires. The leads, the bonding wires, and the chips are encapsulated and protected by a molding compound, or encapsulant. The bottom surfaces of the leads are exposed from the encapsulant for electrical connection to an external device. The wafer is then singulated to divide the structure into individual QFN packages.

When the size of a QFN package is enlarged, the distance between the chip and the leads increases, thus slowing down the performance of the package due to the need for electrical signals to traverse longer distances. One solution to this problem is to add extension portions to the leads to save the lengths of the bonding wires. However, since the extension portions of the leads are exposed from the encapsulant and not connected to any external device, the extension portions of the leads may oxidize when exposed to air.

SUMMARY

One of the present embodiments comprises a semiconductor package. The package comprises a die pad, a die disposed on the die pad, and a first lead disposed about the die pad. The first lead includes a contact element, an extension element extending substantially in the direction of the die pad, and a concave surface disposed between the contact element and the extension element. A second lead having a concave surface is also disposed about the die pad. The first lead concave surface is opposite in direction to the second lead concave surface.

Another of the present embodiment comprises a semiconductor package. The package comprises a die pad, a die disposed on the die pad, and a first lead disposed about the die pad. The first lead has a concave side surface facing toward a lower surface of the package. A second lead having a concave side surface is disposed between the die pad and the first lead. The second lead has a concave surface facing toward an upper surface of the package.

Another of the present embodiment comprises a method of making a plurality of semiconductor packages. The method comprises disposing a plurality of dies on a plurality of leadframes. Each leadframe includes an upper surface, a lower surface opposite the upper surface, a cavity, a plurality of first recesses, and a plurality of second recesses, and wherein (1) the first recesses are formed in the lower surface and define a plurality of first leads, a plurality of extension portions, and a plurality of support ribs connecting the extension portions to the first leads, (2) the second recesses are formed in the upper surface and define a plurality of second leads and a plurality of die pads, (3) depths of the cavities are less than depths of the second recesses, and (4) at least one of the first recesses connects with at least one of the second recesses. The method further comprises electrically connecting the dies with the extension portions and the second leads with a plurality of bonding wires. The method further comprises forming a package panel covering the dies and the bonding wires and filling the first recesses and the second recesses. The method further comprises removing a portion of each leadframe and a portion of the package panel from the lower surfaces to electrically isolate the die pads, the first leads and the second leads. The method further comprises singulating each of the dies by cutting the package panel and removing the support ribs to form the plurality of semiconductor packages.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
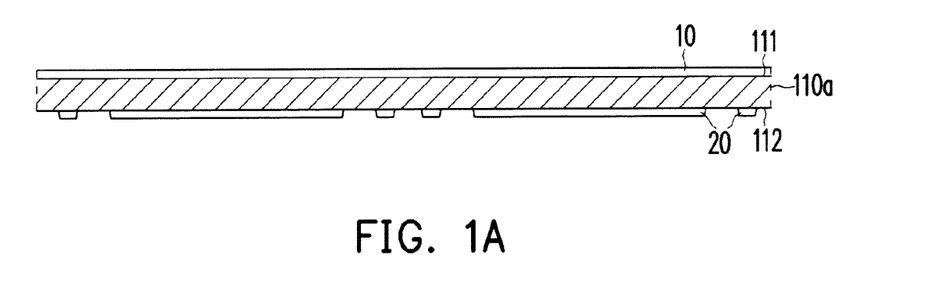
FIGS. 1A-1F are cross-sectional side views showing steps in a method of making a leadframe according one of the present embodiments.

Referring to FIG. 1A, a conductive substrate 110a having an upper surface 111 and a lower surface 112 is illustrated. The conductive substrate 110a may be, for example, copper or iron, or any other conductive material. A mask layer 10 is formed to completely cover the upper surface 111 of the conductive substrate 110a, and a patterned mask layer 20 is formed to cover a portion of the lower surface 112. In the illustrate embodiment, the mask layer 10 and the patterned mask layer 20 can be, for example, a dry film photoresist or a wet photoresist.

Figure 1B:
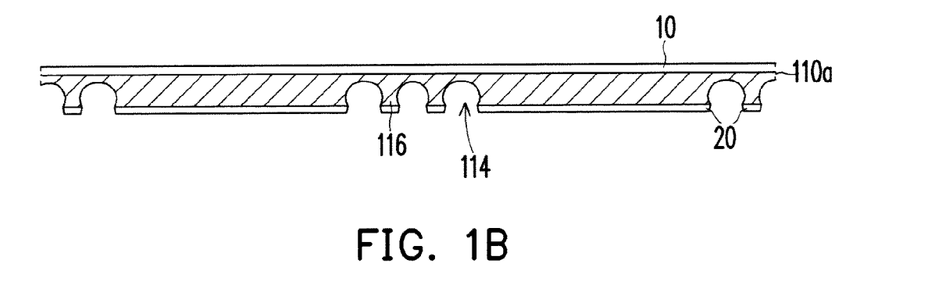

Referring to FIG. 1B, using the patterned mask layer 20 as an etching mask, a half etching process is performed on the lower surface 112 of the conductive substrate 110a to form first recesses 114 in regions of the conductive substrate 110a not covered by the mask layer 20. The first recesses 114 define first leads 116, which may also be referred to as outer leads. When the half etching process is performed, the mask layer 10 covers and protects the upper surface 111 of the conductive substrate 110a. After the half etching process is performed, the mask layer 10 and the patterned mask layer 20 are removed.

Figure 1C:
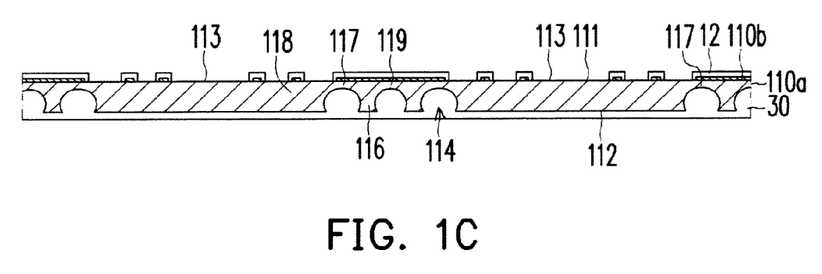
Figure 2:
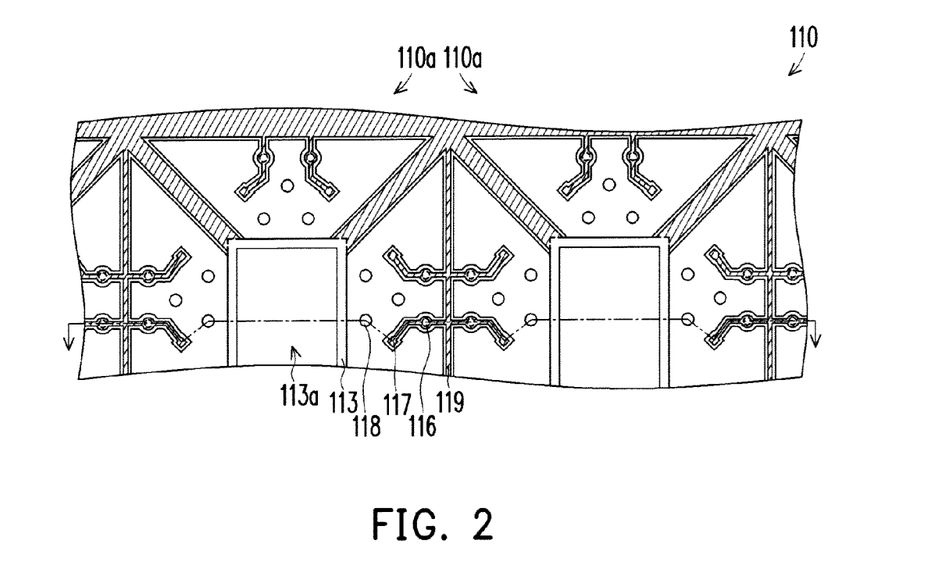
FIG. 2 is a top view of a part of an upper surface of the leadframe of FIG. 1F.

Referring to FIG. 1C, a mask layer 30 is applied to completely cover the lower surface 112 and fill the first recesses 114. A metal layer 110b is selectively plated on the upper surface 111, and a patterned mask layer 12 is formed to cover the metal layer 110b. The metal layer 110b is an anti-oxidation layer, e.g. a surface finishing layer, and may be, for example, gold (Au), Palladium (Pd), nickel (Ni), a combination of the foregoing, or any other material. With reference to FIG. 2, the patterned mask layer 12 defines the patterns of a plurality of die pads 113, first leads 116, extension portions 117 of the first leads 116, second leads 118, which may also be referred to as inner leads 118, and support ribs 119. The extension portions 117 are integral with the first leads 116 and extend inward, toward the corresponding die pads 113.

FIG. 1C illustrates an alternative embodiment that is similar to the embodiment of FIG. 1C, except that the pattern of the metal layer 110b formed in the embodiment of FIG. 1C' is different from that formed in the embodiment of FIG. 1C. Since the patterned mask layer 12 is used as an etching mask, the metal layer 110b is formed only in the regions that are used as the contacts.

Figure 1D:
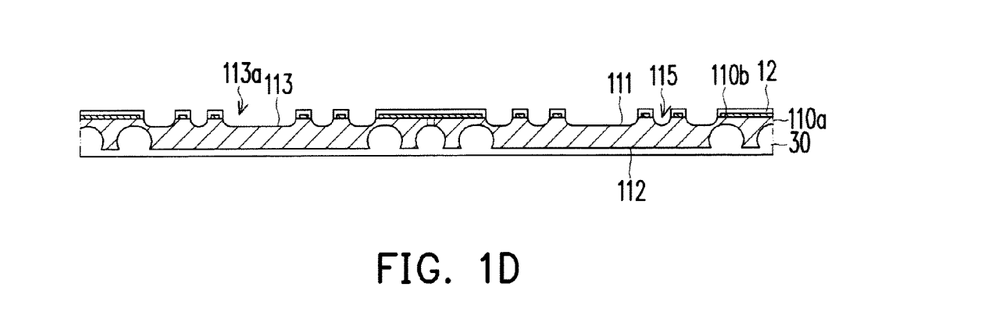

Referring to FIG. 1D, using the patterned mask layer 12 as an etching mask, a half etching process is performed on the upper surface 111 of the conductive substrate 110a to fowl second recesses 115 and cavities 113a of the die pads 113 in regions of the conductive substrate 110a not covered by the patterned mask layer 12. Side surfaces of the second recesses 115 and the cavities 113a have concave profiles.

Figure 1E:
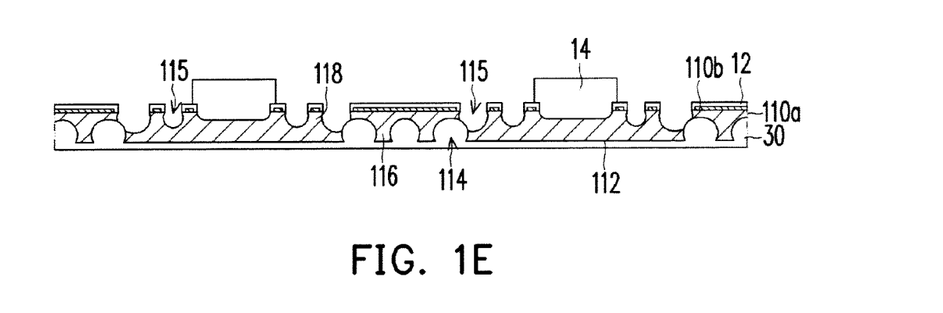

Referring to FIG. 1E, a second patterned mask layer 14 is formed to cover the cavities 113a. Using the patterned mask layers 12, 14 as etching masks, a further half etching process is performed on the conductive substrate 110a to increase the depth of the second recesses 115. After the further half etching process, some of the second recesses 115 connect with the first recesses 114, so that the first leads 116 and the second leads 118 can be electrically and physically isolated from each other. Note that in FIG. 1E the first and second recesses 114, 115 appear to be separated, but after the mask layer 30 is removed they are connected (FIG. 1F).

Figure 1F:
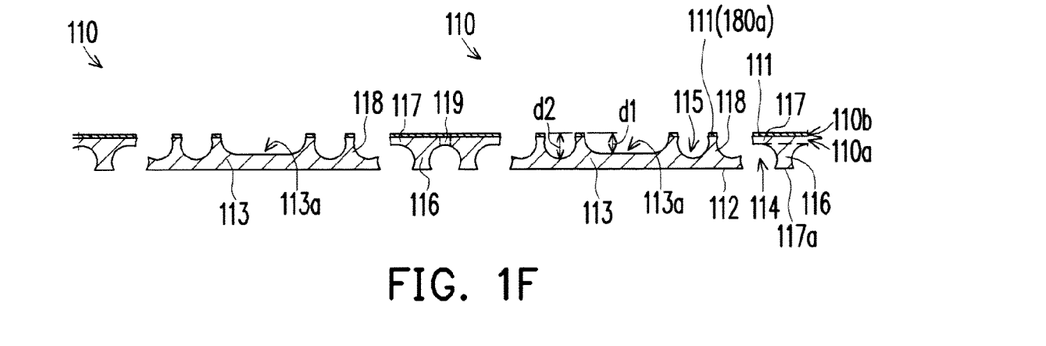

Referring to FIG. 1F after the patterned mask layers 12, 14 and the mask layer 30 are removed, a leadframe strip 110 including a plurality of leadframes 110c is completed. Each of the leadframes 110c has the die pad 113, the cavity 113a of the die pad, the first recesses 114, the second recesses 115, the first leads 116, the extension portions 117 of the first leads 116, the second leads 118 and the metal layer 110b. With reference to FIG. 2, the first leads 116 are connected to the support ribs 119, which are connected to the tie bars 119a, which are connected to the die pads 113 for holding them together. The first leads 116 and the second leads 118 have concave profiles. The cavities cavity 113a of the die pad 113 have the depth d1 that is smaller than the depth d2 of the second recesses 115. This configuration can remain a certain thickness of die pad 113 after the process of isolating the die pad 113 from the second leads 118. Details will be described in the step of FIG. 1L. The cavities 113a also have a flat region for placing a die. Furthermore, the support rib 119 is disposed between two adjacent first leads 116. In this embodiment, the support rib 119 is used to connect a plurality of leadframes 110c, so as to fabricate a plurality of semiconductor packages at the same time. This embodiment illustrates two leadframes connected by the support rib 119 as an example, to show that the leadframes are fabricated in an array.

Figure 1G:
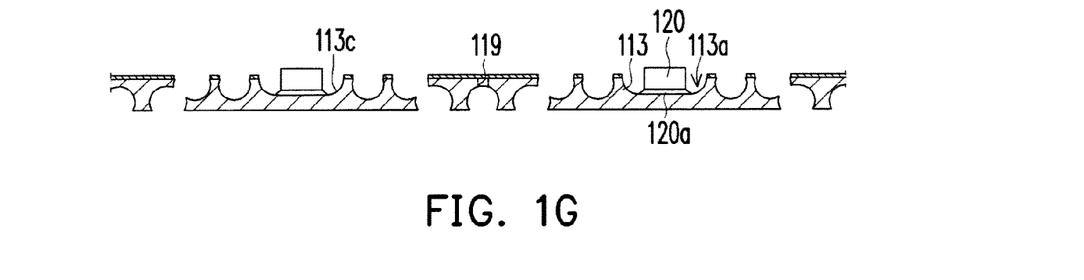
FIGS. 1G-1N are cross-sectional side views showing steps in a method of making a semiconductor package structure according to one of the present embodiments.

FIGS. 1G-1N are cross-sectional side views showing a method for making a semiconductor package structure according to one of the present embodiments. Referring to FIG. 1G, dies 120 are disposed in the cavities 113a of the die pads 113. The dies 120 may be secured within the cavities 113a, such as with an adhesive, such as colloidal silver or another suitable material, for example. The cavities 113a include a curved inner surface 113c facing toward the die 120.

Figure 1H:
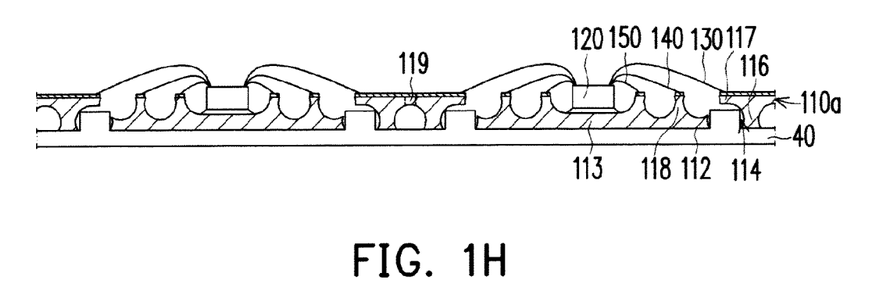

Referring to FIG. 1H, the dies 120 are electrically connected to the extension portions 117 of the first leads 116, the second leads 118, and the die pads 113 with a plurality of bonding wires 130. A heating block 40 can be used to support and heat the first leads 116 and the second leads 118 of the leadframe strip 110. The heating block 40 is positioned on the lower surface 112 and extends into the first recesses 114 to support the extension portions 117 of the first leads 116. The heating block 40 can heat the interface between the bonding wires 130 and the extension portions to enhance the eutectic bonding. Advantageously, since the die 120 electrically connects to the first leads 116 through the bonding wires 130, which are connected between the die 120 and the extension portions 117 of the first leads 116, lengths of the wires 130 can be reduced in comparison to a configuration in which the extension portions 117 are absent.

Figure 1I:
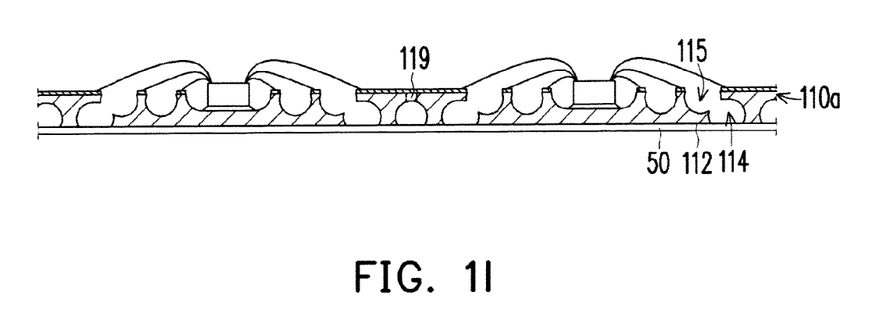

Referring to FIG. 1I, a protective film 50 is adhered to the lower surface 112 of the leadframe strip 110. The protective film 50 can be, for example, a pre-mold tape. The protective film 50 does not extend into the first recesses 114.

Figure 1J:
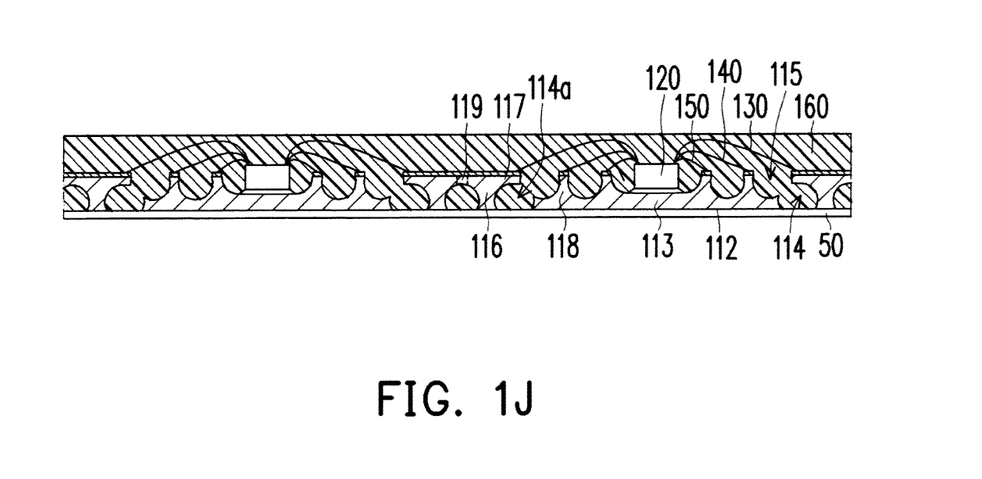

Referring to FIG. 1J, a molding compound 160 is formed to cover the dies 120, the die pads 113, the second recesses 115, the first leads 116, the second leads 118, the support ribs 119 and the bonding wires 130. As discussed above, some of the first recesses 114 connect with the second recesses 115 at reentrant portions 114a. Thus, the molding compound 160 can flow from the second recesses 115 into the first recesses 114 to encapsulate the extension portions 117 of the first leads 116. The protective film 50 adhered to the lower surface 112 of the leadframe strip 110 prevents the molding compound 160 from overflowing to the lower surface 112.

Figure 1K:
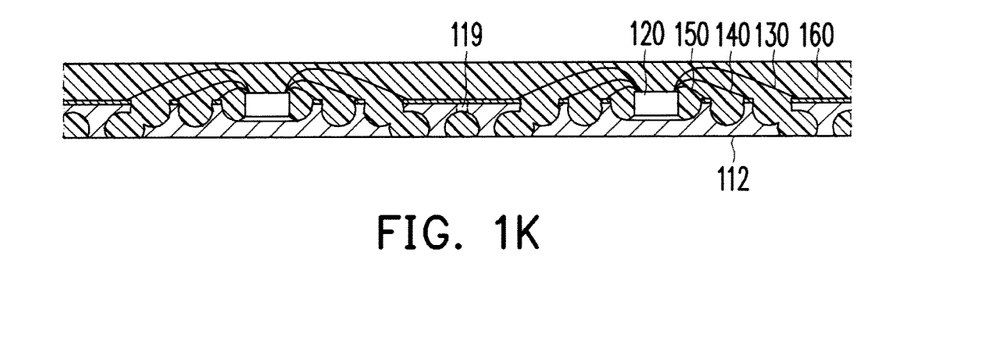
Figure 1L:
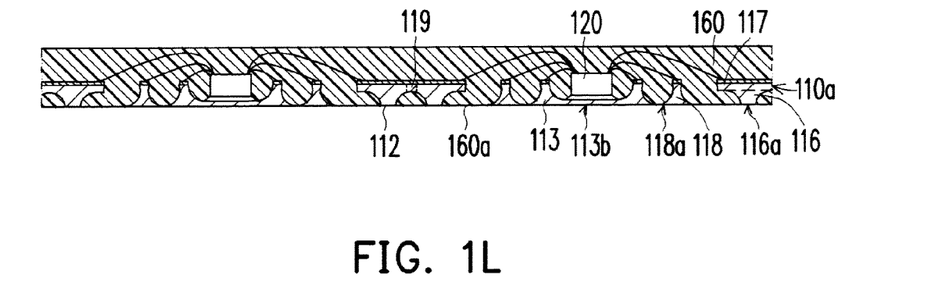

Referring to FIG. 1K, the protective film 50 is removed. Although not shown in the drawing, the lower surface of the molding compound 160 may be slightly depressed from the lower surface 112 of the leadframe 110. Referring to FIG. 1L, a process is performed on the lower surface 112 of the leadframe strip 110 to remove a portion of the conductive substrate 110a and a portion of the molding compound 160 to expose the second recesses 115 and so that the die pads 113 and the second leads 118 are electrically and physically isolated from each other. The process performed may be, for example, grinding, polishing, etching or any other suitable process. Accordingly external surfaces 116a of the first leads 116 and external surfaces 118a of the second leads 118 are also exposed, thus providing contact elements. In this embodiment, since the first depth d1 of the cavities 113a is smaller than the second depth d2 of the second recesses 115, the cavities 113a are not exposed during this process. Therefore, the die pads 113 still have a certain thickness and only external surfaces 113b of the die pads 113 are exposed after the process is complete. The external surfaces 113b, 116a, 118a are coplanar with a lower surface 160a of the molding compound 160. Furthermore, since the second recesses 115 and cavities 113a of the die pads 113 are formed by half etching process, the side surfaces of the die pads 113 and the second leads 118 have concave profiles. More specifically, in the semiconductor packages 100 of this embodiment, the first leads 116 have curved or concave side surfaces 116b that open in a first direction, generally downward, and the second leads 118 have curved or concave side surfaces 118b that open in a second direction opposite the first direction, generally upward. This geometry provides mechanical interlock with the molding compound 160, which resists separation of the leads from the molding compound 160. This geometry also results in lower surfaces 116a of the first leads 116 having smaller surface areas than lower surfaces 118a of the second leads 118.

Figure 1M:
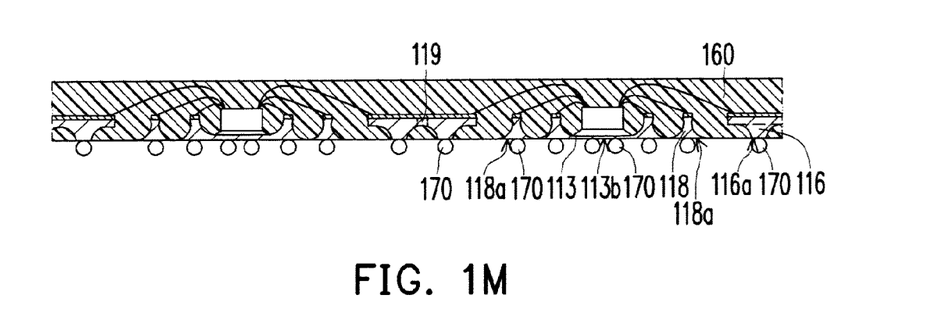

Referring to FIG. 1M, a plurality of solder balls 170 are disposed on external surfaces 113b, 116a, 118a of the die pads 113, the first leads 116, and the second leads 118, respectively, that are exposed outside the molding compound 160. The solder balls 170 advantageously resist oxidation of the external surfaces 113b, 116a, 118a. The solder balls 170 are also used to electrically connect an external circuit (not shown), such as a printed circuit board. The solder balls 170 can be formed by a dip soldering process, a solder printing process, or an electroless plating process, for example, or any other process.

Figure 1N:
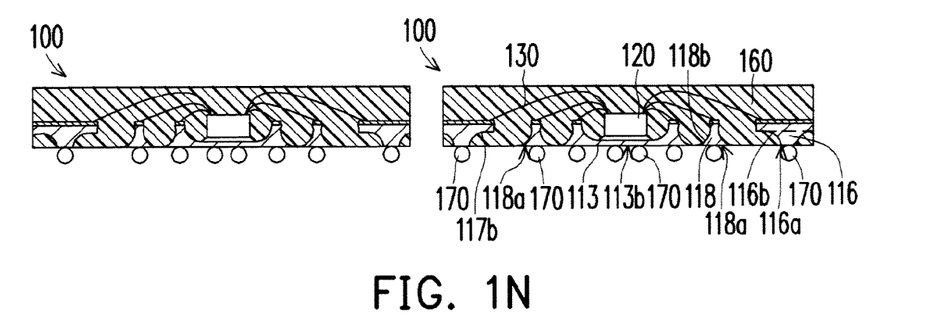

Referring to FIG. 1N, a singulation process is performed to remove the support ribs 119 and a portion of the molding compound 160, to form a plurality of semiconductor packages 100. The singulation may comprise laser cutting, mechanical cutting, etc.

Advantageously, side surfaces 116b, 118b of the first leads 116 and the second leads 118, as well as lower surfaces 117b of the extension portions 117 of the first leads 116, are encapsulated by the molding compound 160. Only the external surface 113b of the die pad 113, the external surfaces 116a of the first leads 116, and the external surfaces 118a of the second leads 118 are exposed. Hence, oxidation of the encapsulated portions of the first leads 116, the extension portions 117 of the first leads 116, and the second leads 118 can advantageously be prevented. Furthermore, the concave side surfaces 113c, 116b and 118b of the die pad 113, the first leads 116 and the second leads 118 are also locking mechanisms to prevent the die pad 113, the first leads 116 and the second leads 118 from delaminating from the molding compound 160.

FIG. 2 illustrates a top plan view of part of an upper surface of the leadframe strip 100 of FIG. 1F. For ease of understanding the connecting relationship between the first leads 116 and the support rib 119, FIG. 2 merely illustrates the upper surface 111, and the metal layer 110b is not shown. The hatching in FIG. 2 indicates that the leadframe strip 100 has been half etched from underneath. The support rib 119 connects the first leads 116 positioned on facing edges of the two adjacent leadframes 110c. The support rib 119 thus connects adjacent leadframes 110c to form one leadframe strip 110, so that multiple semiconductor packages 100 can be fabricated at the same time.

With further reference to FIG. 2, the extension portions 117 of the first leads 116 extend away from the first leads 116 at a non-zero angle. In alternative embodiments, the extension portions 117 may extend away from the first leads 116 in any direction, including along a same straight line traced by the first leads 116. The extension portions 117 may, for example, be routed so as to reduce a distance between the extension portions 117 and the second leads 118. Reducing this distance advantageously reduces the length of bond wire 130 needed to connect the die 120 with the extension portions 117.

Figure 3:
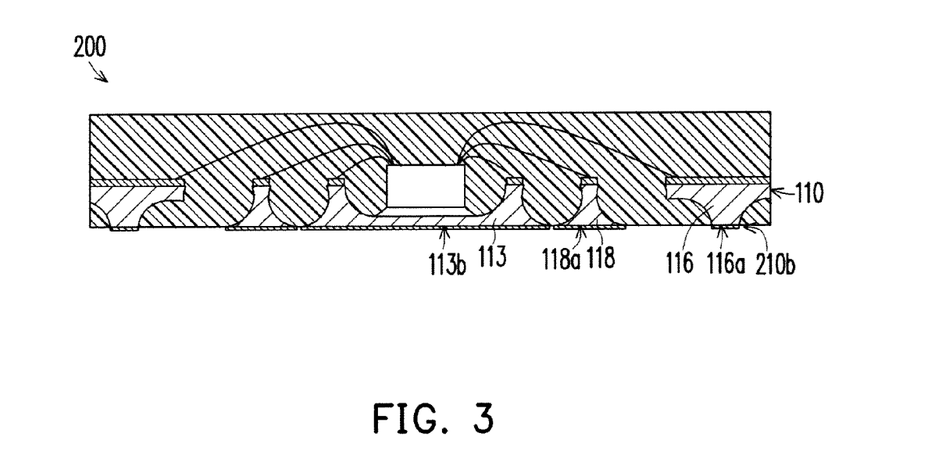
FIG. 3 is a cross-sectional side view of a semiconductor package structure according to one of the present embodiments.

Referring to FIG. 3, a cross-sectional view of another semiconductor package structure according to an embodiment of the invention is illustrated. A difference between a semiconductor package 200 and the semiconductor package 100 is that a second metal layer 210b is disposed on the external surface 113b of a die pad 113, the external surface 116a of the first leads 116, and the external surface 118a of the second leads 118. The second metal layer 210b can prevent the oxidation of the external surface 113b of the die pad 113, the external surface 116a of the first leads 116, and the external surface 118a of the second leads 118. In addition, the semiconductor package 200 is electrically connected with an external circuit (not shown), such as a printed circuit board, through the second metal layer 210b. A material of the second metal layer 210b can be selected from a group consisting of Au, Pd, Ni, or a combination of the foregoing, but is not limited to the foregoing. The material of the second metal layer 210b can be different from the material of the metal layer 110b.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
a die pad;
a die disposed on the die pad;
a first lead disposed about the die pad, the first lead including a contact element, an extension element extending substantially in the direction of the die pad, and a concave surface disposed between the contact element and the extension element; and
a second lead disposed about the die pad, the second lead having a concave surface;
wherein the first lead concave surface and the second lead concave surface face one another; and
wherein the first lead concave surface is beneath an upper surface of the first lead.

2. The semiconductor package of claim 1, wherein the first lead concave surface receives a portion of a molding compound located underneath the first lead to lock the first lead within the package.

3. The semiconductor package of claim 1, wherein the die pad includes a cavity having a curved inner surface, and the curved inner surface faces toward the die.

4. The semiconductor package of claim 1, further comprising a metal layer disposed on lower surfaces of the first leads, the second leads and the die pad, wherein the second metal layer protrudes from a lower surface of the package body.

5. The semiconductor package of claim 1, further comprising a package body, wherein the package body covers the side surfaces of the first and second leads and lower surfaces of the extension elements, but leaves exposed lower surfaces of the die pad and the first and second leads.

6. The semiconductor package of claim 1, wherein the extension element extends diagonally between the contact element and the die pad.

7. The semiconductor package of claim 6, further comprising a plurality of first leads, wherein the first leads are grouped in pairs, and the extension elements of each pair diverge from one another in a direction toward the die pad.

8. The semiconductor package of claim 1, wherein surface areas of lower surfaces of the first leads are smaller than surface areas of lower surfaces of the second leads.

9. The semiconductor package of claim 1, further comprising a package body, wherein the package body includes a lower surface, and the lower surface of the package body is coplanar with lower surfaces of the die pad, the first leads, and the second leads.

10. A semiconductor package, comprising:
a die pad;
a die disposed on the die pad;
a first lead disposed about the die pad, the first lead including a contact element and an extension element extending substantially in the direction of the die pad, and having a concave side surface facing toward a lower surface of the package; and
a second lead disposed between the die pad and the first lead, the second lead having a concave side surface facing toward an upper surface of the package;
wherein the first lead concave side surface is beneath an upper surface of the first lead.

11. The semiconductor package of claim 10, wherein the first lead concave side surface receives a portion of a molding compound located underneath the first lead to lock the first lead within the package.

12. The semiconductor package of claim 10, wherein the die pad further comprises a cavity having a concave inner surface facing toward the die and the upper surface of the package.

13. The semiconductor package of claim 10, wherein the extension element extends diagonally between the contact element and the die pad.

14. The semiconductor package of claim 13, further comprising a plurality of first leads, wherein the first leads are grouped in pairs, and the extension elements of each pair diverge from one another in a direction toward the die pad.

15. The semiconductor package of claim 10, wherein surface areas of lower surfaces of the first leads are smaller than surface areas of lower surfaces of the second leads.

16. A semiconductor substrate, comprising:
a die pad;
a first lead disposed about the die pad, the first lead including a contact element, an extension element extending substantially in the direction of the die pad, and a concave surface disposed between the contact element and the extension element; and
a second lead disposed about the die pad, the second lead having a concave surface;
wherein the first lead concave surface and the second lead concave surface face one another; and
wherein the first lead concave surface is beneath an upper surface of the first lead.

17. The semiconductor substrate of claim 16, wherein the extension element extends diagonally between the contact element and the die pad.

18. The semiconductor substrate of claim 17, further comprising a plurality of first leads, wherein the first leads are grouped in pairs, and the extension elements of each pair diverge from one another in a direction toward the die pad.

* * * * *